(12) United States Patent
Asada (10) Patent No.: US 8,723,242 B2
(45) Date of Patent: May 13, 2014

(54) NON-VOLATILE SEMICONDUCTOR MEMORY DEVICE AND METHOD OF MANUFACTURING THE SAME

(75) Inventor: Kazuhiro Asada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 13/072,040

(22) Filed: Mar. 25, 2011

(65) Prior Publication Data

US 2011/0233618 A1  Sep. 29, 2011

(30) Foreign Application Priority Data

Mar. 26, 2010  (JP) .................................. 2010-073711

(51) Int. Cl.
*H01L 27/108* (2006.01)
(52) U.S. Cl.
USPC ................... 257/298; 257/209; 257/E23.146; 257/296; 257/297; 365/185.25
(58) Field of Classification Search
USPC .......... 257/209, E23.146, E21.571, 296–298; 438/637; 365/185.25, 185.23
See application file for complete search history.

(56) References Cited

U.S. PATENT DOCUMENTS

2009/0035907 A1* 2/2009 Ikeda ............................ 438/266
2009/0159956 A1 6/2009 Asada et al.

FOREIGN PATENT DOCUMENTS

JP  2009-158590  7/2009

* cited by examiner

*Primary Examiner* — Tom Thomas
*Assistant Examiner* — Elias M Ullah
(74) *Attorney, Agent, or Firm* — Oblon, Spivak, McClelland, Maier & Neustadt, L.L.P.

(57) ABSTRACT

A non-volatile semiconductor memory device and a method of manufacturing the same of the embodiments are provided. The non-volatile semiconductor memory device includes: drain contact plugs formed in memory cell regions and having bottom ends joined to drain diffusion layers of the respective memory cells; a local interconnect provided to extend in a WL direction across the memory cell regions and a shunt region, and having a bottom end joined commonly to plural source diffusion layers; drain via plugs formed in the memory cell regions and having bottom ends joined to the top ends of the respective drain contact plugs; and a power supply via for source formed in the shunt region to extend in a BL direction, and having a bottom end joined to the top end of the local interconnect.

3 Claims, 7 Drawing Sheets (a)

(b) A-a SECTION

BL direction

WL direction (b) A-a SECTION

BL direction

NON-VOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from the prior Japanese Patent Application No. 2010-073711, filed on Mar. 26, 2010, the entire contents of which are incorporated herein by reference.

FIELD

The embodiments relate to a non-volatile semiconductor memory device and a method of manufacturing the same.

BACKGROUND

Non-volatile semiconductor memory devices, which are not only electrically writable and deletable but also capable of keeping stored data even if the power supply is cut off, have become a mainstream of memories in the memory market. The technological advance of such memories has been greatly attributable to the miniaturization of semiconductor integrated circuits. The miniaturization of semiconductor integrated circuits relies on the photolithography technique, especially. The photolithography technique is implemented using an exposure apparatus to expose a photoresist applied on a semiconductor wafer to a desired pattern of light projected, and also using a mask for exposure, which is called a reticle, with a microscopic pattern. A pattern of contact holes is one of the difficult patterns for the photolithography technique. A non-volatile semiconductor memory device includes a memory cell transistor as a principal constituent element, and microscopic diffusion layers, called a drain region and a source region, are formed in the memory cell transistor, The wiring in the upper layer needs to form contacts with the microscopic diffusion layers through either contact plugs or local interconnects formed in the interlayer insulation layer. Each contact with the drain region (drain diffusion layer) must be formed with certainty on the microscopic diffusion layer to prevent short circuit to the adjacent bit. A source potential is applied from the metal wiring in the upper layer to the local interconnect through the via contacts shunting for each memory cell array, and is then applied from the local interconnect to the source diffusion layers of the respective memory cells.

In the case of conventional non-volatile semiconductor memory devices, however, there is a problem that via-contact holes for supplying the source potential are patterned in units of memory cell arrays, which in turn causes disruption of the cyclic pattern of memory cells. Specifically, when the via-contact holes for drain and the via-contact holes for supplying the source potential are lithographed with a single reticle, the process margin is decreased significantly.

Accordingly, in the conventional non-volatile semiconductor memory devices, each shunt region is formed to have a width equivalent to two pitches of the memory cells to minimize the disruption of the cyclic pattern of memory cells. In this way, both of the patterning of the via-contact holes for drain and the patterning of the via-contact holes for supplying the source potential are stabilized. However, it is basically desirable that the width assigned to each shunt region be as small as a single pitch of the memory cells. Assigning a two-pitch width to each shunt region poses a problem of directly increasing the total area of the chip. For example, having a hundred shunt regions, a chip has an area penalty, as a whole, that is one hundred times larger than the area penalty for each single shunt region.

DETAILED DESCRIPTION

In general, according to one embodiment, A non-volatile semiconductor memory device includes a plurality of memory cells formed on a surface of a semiconductor substrate, a plurality of first memory cell rows in each of which some of the plurality of memory cells are arranged in a second direction while sharing source diffusion layers and drain diffusion layers, a plurality of second memory cell rows formed by arranging the plurality of first memory cell rows in a repeated manner in a first direction that is perpendicular to the second direction, a plurality of memory cell regions in each of which two or more of the plurality of second memory cell rows are arranged; a shunt region located between each adjacent two of the memory cell regions arranged in the first direction, a drain contact plug which is provided in each of the memory cell regions and which is formed to have a bottom end electrically connected to the drain diffusion layer of each adjacent two of the plurality of memory cells, a line-shaped local interconnect which is formed to extend in the first direction across the memory cell region and the shunt region and to have a bottom end electrically connected commonly to the source diffusion layers of the plurality of memory cells belonging to each of the plurality of the first memory cell rows, a drain via plug which is provided in the memory cell region and which is formed to have a bottom end electrically connected to a top end of the drain contact plug, and a line-shaped power supply via for source which is formed to extend in the shunt region in the second direction, and to have a bottom end electrically connected to a top end of the local interconnect at a portion where the line-shaped power supply via for source intersects the interconnect in a perpendicular manner.

An embodiment of the invention will be described with reference to the drawings.

(First Embodiment)

Figure 1:
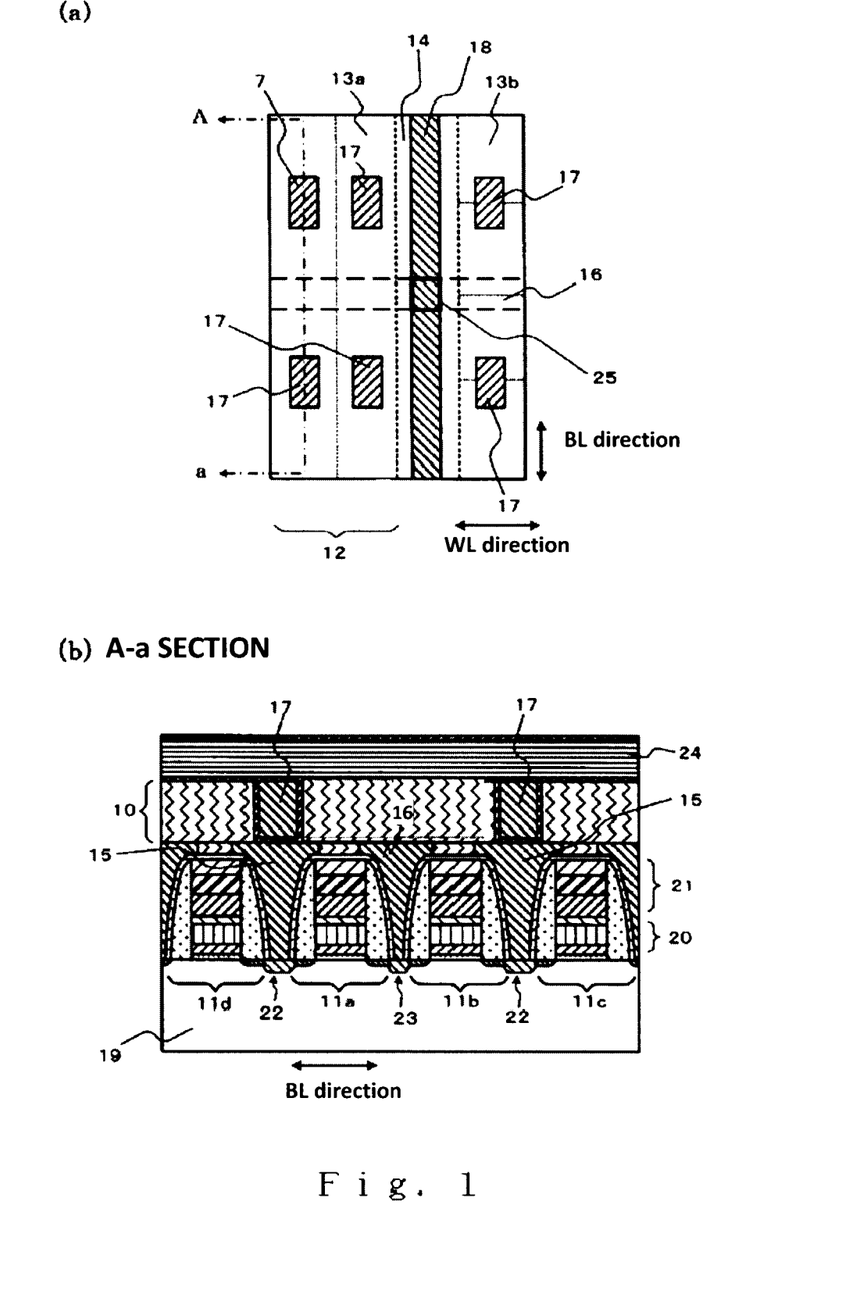
FIG. 1 is an image diagram illustrating the structure of a non-volatile semiconductor memory device of an embodiment.

FIG. 1 is an image diagram illustrating the structure of a non-volatile semiconductor memory device of an embodiment of the invention. Specifically, FIG. 1 shows mainly a via-contact layer 10 near a shunt region 14 in a memory cell array. There are memory cell regions 13a, 13b and shunt region 14 in the memory cell array of the non-volatile semiconductor memory device. In the memory cell regions 13a, 13b, memory cells are arranged in rows and columns. A source line (not shown in FIG. 1; see FIGS. 6 and 7) shunting the sources of memory cells for individual memory cell arrays extends in the shunt region 14.

FIG. 1A is a plan view of a via-contact layer 10. Specifically, FIG. 1A is an image diagram illustrating a portion related to the structure of a drain via plug 17 and a power supply via 18 for source. In FIG. 1A, the side-to-side direction of the sheet is referred to as a WL direction in which each word line (hereinafter also referred to as WL) extends whereas the up-and-down direction is referred to as a BL direction in which each bit line extends.

FIG. 1B is a sectional view illustrating a section taken along the line A-a of FIG. 1A including an upper-layer wiring (BL). In FIG. 1B, the side-to-side direction of the sheet corresponds to the BL direction.

For the purpose of showing the relative positions of various constituent elements, FIG. 1A, though it is an image of the via-contact layer 10, also illustrates other constituent elements, such as local interconnect 16, that are formed in layers other than the via-contact layer 10. Specifically, drain via plugs 17 and a power supply via 18 for source, which are formed in the via-contact layer 10, are hatched. Of the other elements, the local interconnect 16 is shown by dashed lines, the boundaries between each of memory cell regions 13a, 13b and a shunt region 14 are shown by dotted lines whereas the boundary between two memory cell rows 12 are shown by a line of small dots.

The non-volatile semiconductor memory device of the embodiment of the invention includes memory cells 11a to 11d, the memory cell rows 12, the memory cell regions 13a, 13b, the shunt region 14, plural drain contact plugs 15, the local interconnect 16, the plural drain via plugs 17, and the power supply via 18 for source.

As FIG. 1B shows, the memory cells 11a to 11d are formed on a principal surface of a semiconductor substrate 19. Each of the memory cells 11a to 11d includes a gate electrode, a drain diffusion layer 22, and a source diffusion layer 23. The gate electrode has a dual-layer structure including a floating gate electrode 20 and a control gate electrode 21. The drain diffusion layer 22 has an LDD (lightly doped drain) structure. Of the memory cells 11a to 11d, each two memory cells that are next to each other in the BL direction are formed in such a manner as to share either the corresponding source diffusion layer 23 or the corresponding drain diffusion layer 22. For example, the memory cells 11a and the memory cells 11b share the source diffusion layer 23 whereas the memory cells 11b and the memory cells 11c share the drain diffusion layer 22. In the following description, a set of the memory cells 11a to 11d will be sometimes referred to as a first memory cell row.

Each memory cell row 12 includes plural sets of the memory cells 11a to 11d (i.e., plural first memory cell rows) arranged repeatedly at a predetermined pitch in the WL direction. The control gate electrode 21 is connected commonly to the memory cells 11a, the memory cells 11b, the memory cells 11c and the memory cells 11d that belong to the same first memory cell row, and functions as a word line (not shown in FIG. 1; see FIG. 3 instead). Each word line is formed across the memory cell regions 13a, 13b and the shunt region 14.

The memory cell regions 13a, 13b are regions where the memory cell rows 12 are arranged. The shunt region 14 is a region located between the two memory cell regions 13a, 13b arranged in the WL direction. The shunt region 14 is a region where both of the power supply via 18 for source and the source line of the upper-layer wiring are formed.

Drain contact plugs 15 are formed respectively on the corresponding drain diffusion layers 22 to electrically connect a bit line 24 and the drain diffusion layers 22. The bottom end of each contact plug 15 is joined to the corresponding drain diffusion layer 22 in a self-aligned manner while the upper end of each contact plug 15 is electrically connected to the bit line 24 with the corresponding drain via plug 17 located in between. Thus, the contact between the bit line 24 and each drain diffusion layer 22 is provided by the corresponding drain contact plug 15 and the corresponding drain via plug 17. As FIG. 1B shows, the drain diffusion layers 22 of the set of memory cells 11a to 11d arranged in the BL direction are electrically connected to the same bit line 24. On the other hand, the drain diffusion layers 22 of the memory cells that are next to each other in the WL direction are electrically connected to different bit lines.

Figure 3:
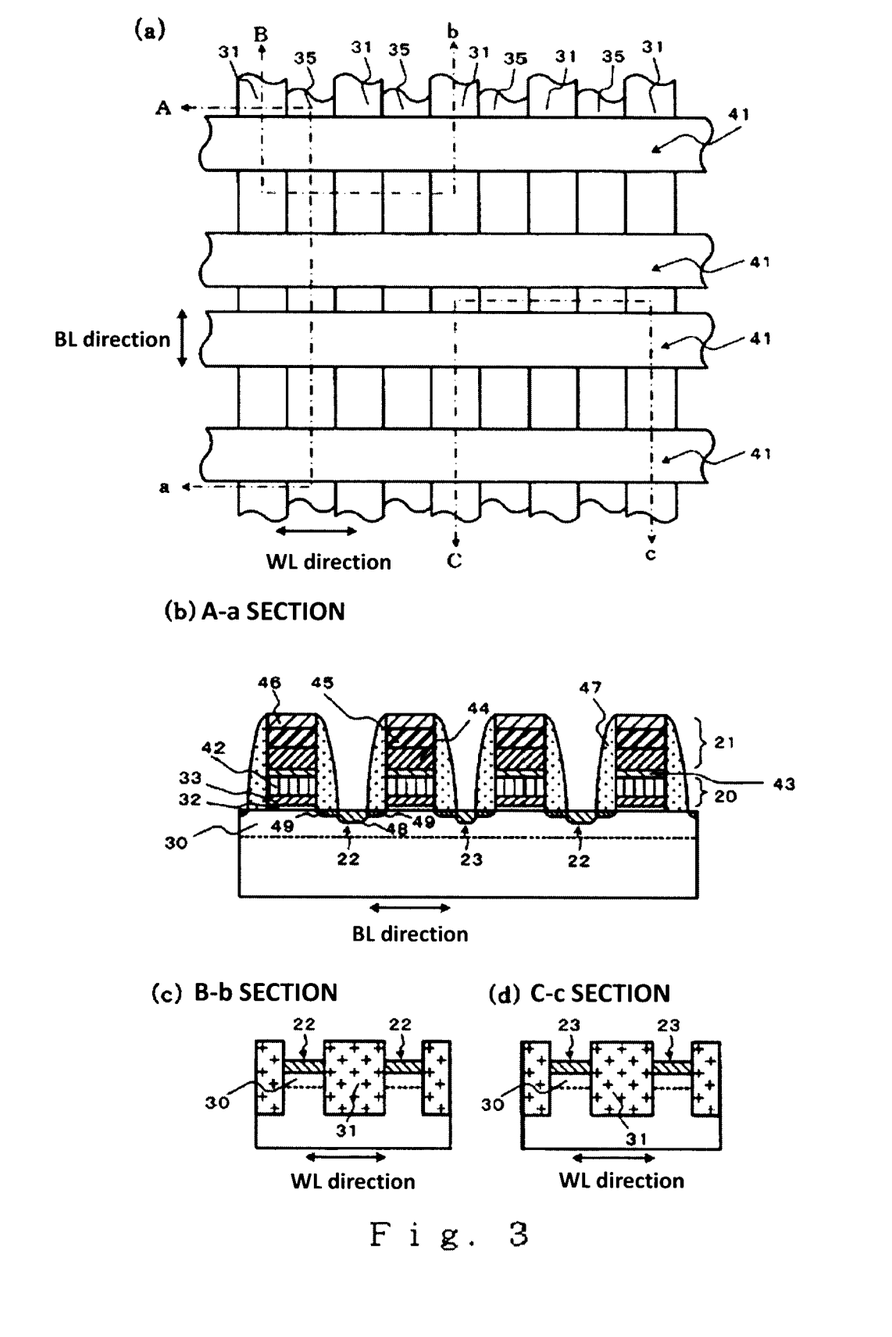
FIG. 3 is a diagram illustrating a step included in the method of manufacturing the non-volatile semiconductor memory device of the embodiment.

The drain contact plugs 15 are formed in a self-aligned manner using the gate electrodes. Hence, as FIG. 1B shows, the section of each drain contact plug 15 taken in the BL direction has a shape that gradually narrows from the widest upper portion towards the lower portion along sidewall spacers 47 (see FIG. 3B) of the gate electrodes. The bottom portion of each drain contact plug 15 is joined to the corresponding drain diffusion layer 22 in a self-aligned manner.

The local interconnects 16 are formed respectively on the source diffusion layers 23 to electrically connect the source diffusion layers 23 to the source line. The bottom end of the each local interconnect 16 is joined to the corresponding source diffusion layer 23 in a self-aligned manner while the upper end of each local interconnect 16 is electrically connected to a source line 63 with the corresponding power supply via 18 for source provided in between. Thus, the contact between the source line and each source diffusion layer 23 is provided by the corresponding local interconnect 16 and the corresponding power supply via 18 for source. The electric power supplied to the source diffusion layer 23 has the ground potential, which is common to all the memory cells. Hence, each local interconnect 16 has a line shape extending in the WL direction across the memory cell regions 13a, 13b and the shunt region 14, and supplies electric power with the same source potential to all the memory cells that share the same source diffusion layer 23. In addition, like the drain contact plugs 15, each local interconnect 16 has a sectional shape taken in the BL direction that narrows from the widest upper portion to the lower portion, and the bottom portion of each local interconnect 16 is joined to the corresponding source diffusion layer 23 in a self-aligned manner.

For the purpose of electrically connecting the bit line 24 and the drain diffusion layers 22, the drain via plugs 17 are formed in the via-contact layer 10 and located above their corresponding drain contact plugs 15. The bottom end of each drain via plug 17 is joined to the top end of the corresponding drain contact plug 15 while the top end of each drain via plug 17 is joined to the corresponding bit line.

For the purpose of electrically connecting the source lines and the source diffusion layers 23, the power supply vias 18 for source are formed in the via-contact layer 10 within the shunt region 14 so that each power supply via 18 for source has a line shape extending in the BL direction. The bottom end of each power supply via 18 for source is joined to the top end of each local interconnect 16 at a portion where the power supply via 18 for source intersects the local interconnect 16 in a perpendicular manner (the portion will be referred to as a joint portion 25, which is shown by thick lines in FIG. 1A).

On the other hand, the top end of the power supply via 18 for source is joined to the bottom surface of the corresponding one of the source lines each of which extends in the BL direction like each bit line 24.

Both of the bit lines 24 and the source lines are formed to be arranged at the same repeating pitch in the WL direction. Hence, since both of the drain via plugs 17 and the power supply vias 18 for source are formed in the same via-contact layer 10, the repeating pitch of the drain via plugs 17 in a sectional view taken in the WL direction is equal to the repeating pitch of the power supply vias 18 for source in the same sectional view. In this way, the cyclic pattern in the WL direction within the via-contact layer 10 is secured perfectly.

Next, a method of manufacturing a non-volatile semiconductor memory device with the above-described structure will be described. The following description is based on a case where a p-type silicon substrate is used as a semiconductor substrate 19. In addition, deep n-well regions are firstly formed in the semiconductor substrate 19 to correspond to the regions where a memory cell array is formed, and then a p-well region 30 is formed in each n-well region.

Each of FIGS. 2 to 7 represents a step included in the method of manufacturing a non-volatile semiconductor memory device of an embodiment of the invention. The part A of each of FIGS. 2 to 7 is a plan view after the corresponding step. In each of these drawings, the side-to-side direction of the sheet is the WL direction whereas the up-and-down direction of the sheet is the BL direction. In addition, for the purpose of showing the relative positions of constituent elements, the part A of each of FIGS. 2 to 7 does not illustrate an interlayer insulation layer but illustrates the structure located below the interlayer insulation layer.

The part B of each of FIGS. 2 to 7 shows a section taken in the line A-a of the part A (the plan view) of the same one of FIGS. 2 to 7. To put it differently, the sectional view of each part B shows the sectional structure taken in the channel-lengthwise direction (BL direction) of memory cells 11$a$ to 11$d$. In each sectional view of the part B, the side-to-side direction of the sheet is the BL direction. The part C of each of FIGS. 2 to 7 shows a section taken in the line B-b of the part A (the plan view) of the corresponding one of FIGS. 2 to 7. To put it differently, each part C shows the sectional structure taken in the WL direction and including drain diffusion layers 22, drain contact plugs 15, and drain via plugs 17. The part D of each of FIGS. 2 to 7 shows a section taken in the line C-c of the part A (the plan view) of the corresponding one of FIGS. 2 to 7. To put it differently, each part D shows the sectional structure taken in the WL direction and including source diffusion layers 23, local interconnects 16, and power supply vias 18 for source. In each of the parts C and parts D, the side-to-side direction of the sheet is the WL direction.

Figure 2:
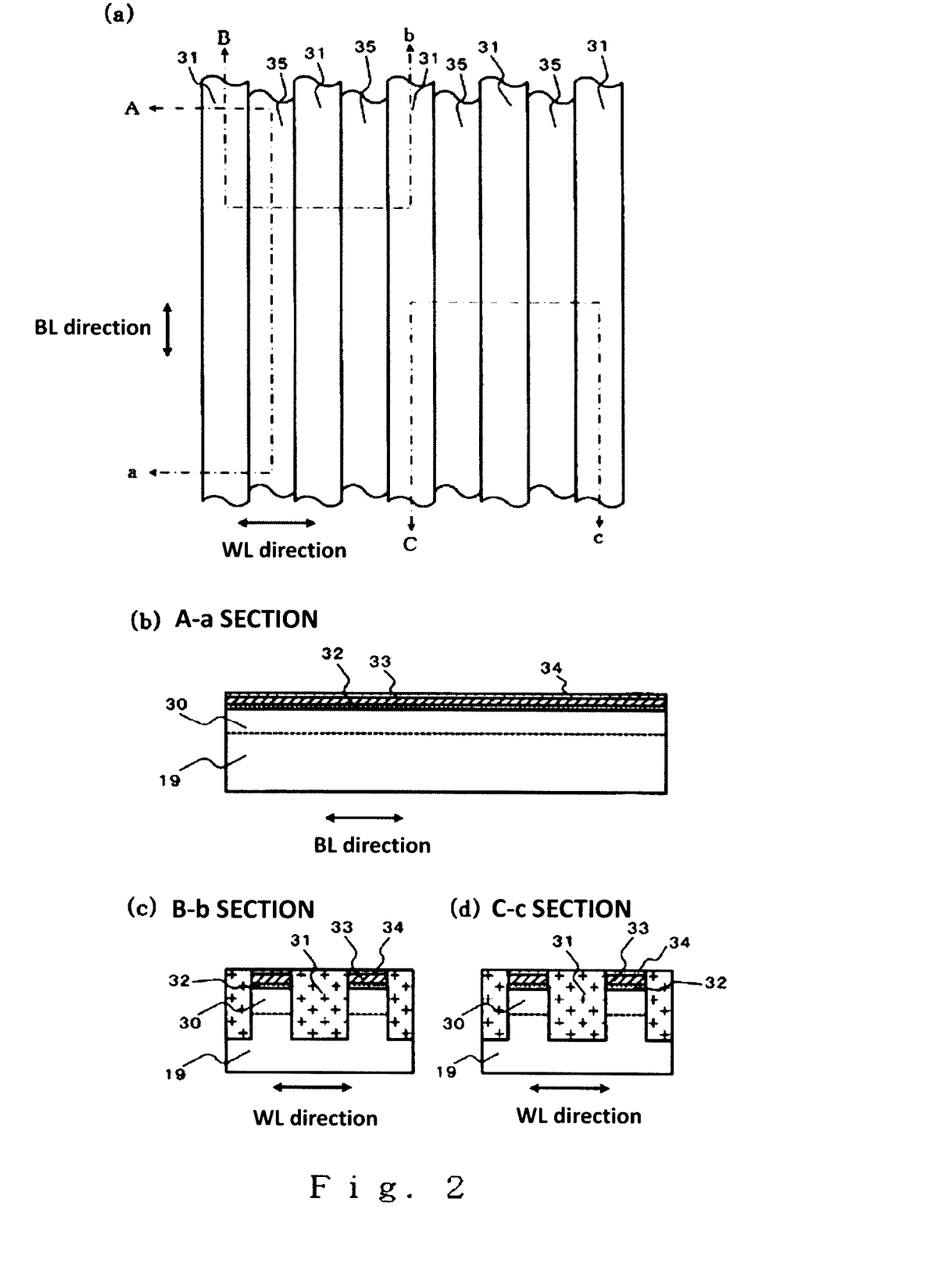
FIG. 2 is a diagram illustrating a step included in a method of manufacturing the non-volatile semiconductor memory device of the embodiment.

FIG. 2 shows a first step that illustrates the structure after device isolation regions 31 are formed. Firstly, a first silicon oxide layer which serves as a tunnel insulation film 32 is formed on a principal surface of the semiconductor substrate 19. Then, a first poly-crystalline silicon layer 33 which is to be a part of a floating gate electrode 20 of the memory cell is deposited. After that, a first silicon nitride layer 34 and then a second silicon oxide layer, both of which serve as a first mask material, are formed sequentially.

Subsequently, trenches are formed in the portions where the device isolation regions 31 are to be formed. In this step, a resist pattern to form the openings of the device isolation regions 31 is formed on the second silicon oxide layer in a photolithography process. The resist pattern is formed as a pattern with stripe-shaped openings each extending in the BL direction in the memory cell array. Both of the second silicon oxide layer and the first silicon nitride layer 34 (first mask material) are etched in an RIE (reactive ion etching) method using the resist pattern thus formed as a mask. Then, the first poly-crystalline silicon layer 33, the tunnel insulation film 32, and the semiconductor substrate 19 are etched in an RIE method using the resultant first mask material as a mask, and thus the trenches are formed. The trenches are formed more deeply than the p-well regions 30 to reliably isolate the devices.

After that, a buried insulating film is deposited to sufficiently bury the resultant trenches, the tunnel insulation film 32, the first poly-crystalline silicon layer 33, and the first mask material. A silicon oxide film, for example, is chosen as the buried insulating film. Then, in a chemical mechanical polishing (CMP) process using the first silicon nitride layer 34 in the first mask material as a stopper for the polishing, the deposited buried insulating film and the second silicon oxide layer in the first mask material are polished to have flat surfaces. In this polishing process, the second silicon oxide layer is removed together with the upper portion of the buried insulating film. Thus, the surface of the first silicon nitride layer 34 has the same height as the height of the surfaces of the buried insulating films in the trenches.

As a result of the above-described first step, the device isolation regions 31 are formed as STIs (shallow trench isolations) by burying silicon oxide films in the trenches, and device forming regions 35 are formed as the regions each of which is between two device isolation regions 31, as FIGS. 2C and 2D show. Each device forming region 35 includes the tunnel insulation film 32, the first poly-crystalline silicon layer 33, and the first silicon nitride layer 34 that are formed one upon another.

FIG. 3 shows a second step that illustrates the structure after gate electrodes of the memory cells are formed. The gate electrode of each memory cell has a dual-layer structure including a floating gate electrode 20 and a control gate electrode 21. Each control gate electrode 21 is connected commonly to memory cells arranged in the WL direction, and serves as a word line 41 (WL). Each word line 41 is formed across the device forming regions 35 and the device isolation regions 31.

Firstly, the structure shown in FIG. 2 is subjected to a treatment with phosphoric acid to remove the first silicon nitride layer 34. Then a second poly-crystalline silicon layer 42 is deposited, and then a resist pattern is formed on the second poly-crystalline silicon layer 42 in a photolithography process. In a dry etching process using the resist pattern thus formed, the deposited second poly-crystalline silicon layer 42 are processed to be isolated from each other by the device isolation regions 31. Thus, the first poly-crystalline silicon layers 33 and the second poly-crystalline silicon layers 42 are laminated and are formed into stripes extending in the BL direction. The first poly-crystalline silicon layers 33 and the second poly-crystalline silicon layers 42 thus formed serve as the floating gate electrodes 20 of the memory cells. Note that each stripe of first poly-crystalline silicon layer 33 and the second poly-crystalline silicon layer 42 is divided into pieces for respective memory cells in a later step of forming the control gate electrode 21. Thus, each of the floating gate electrodes 20 of the memory cells is formed to be insulated from adjacent memory cells.

Subsequently, for example, an ONO layer—a layer including a silicon oxide layer, a silicon nitride layer, and a silicon oxide layer that are formed one upon another—is formed as an inter-gate insulating layer 43 in a low-pressure CVD process. Then, a third poly-crystalline silicon layer 44 added with phosphorus is formed on the ONO layer, and then a tungsten silicide (WSi) layer 45 is formed on the crystalline silicon layer 44. After that, a second silicon nitride layer 46 is deposited. The second silicon nitride layer 46 is used as a gate CAP material in a later process to form the dual-layer gate electrodes.

Subsequently, the dual-layer gate electrodes each including the floating gate electrode 20 and the control gate electrode 21 are formed. Firstly, a resist pattern is formed on the second silicon nitride layer 46 in a photolithography method. The resist pattern corresponds to the word lines 41 each extending in the WL direction in the memory cell array. Then, the second silicon nitride layer 46, the tungsten silicide layer 45, the third poly-crystalline silicon layer 44, the inter-gate insulating layer 43, the second poly-crystalline silicon layer 42, and the first poly-crystalline silicon layer 33 are anisotropically etched in an RIE method using the resist pattern as a mask. Thus formed are the gate electrodes. In this process, each stripe of the floating gate electrode 20 is divided, in the BL direction, into pieces corresponding respectively to the memory cells.

Subsequently, the drain diffusion layer 22 is formed on one side of each gate electrode in the BL direction and the source diffusion layer 23 is formed on the other side. This embodiment describes an exemplar case where high-density n-type impurity regions ($n^+$ diffusion layers 48) that form the drains and the sources are formed in the memory cells as well as low-density n-type impurity regions ($n^-$ diffusion layers 49) that form low-density drains (LDDs) are formed in the memory cells.

Firstly, in an oxidation treatment process, a fourth silicon oxide layer of a desired thickness is formed on the side surfaces of the first poly-crystalline silicon layer 33, the second poly-crystalline silicon layer 42, the third poly-crystalline silicon layer 44, and the tungsten silicide layer 45 of each gate electrode.

Subsequently, low-density n-type impurity regions (n diffusion layers 49) are formed in a process of ion implantation into the surfaces of the semiconductor substrate 19. Ions are implanted into the portions of the device forming regions 35 where no gate electrodes are formed. Then, sidewall spacers 47 are formed on the sidewalls of the gate electrodes. Specifically, the sidewall spacers 47 are formed by firstly depositing a silicon nitride film to bury the gate electrodes, and then etching back the silicon nitride film. After that, an ion implantation process using the sidewall spacers 47 as a mask is performed to form high-density n-type impurity regions ($n^+$ diffusion layers 48). As a consequence, on the two sides of each of the gate electrodes in the device forming regions 35, the $n^-$ diffusion layers 49 are formed in the surface regions that respectively lie under the sidewall spacers 47 while the $n^+$ diffusion layers 48 are formed in the surface regions that are located at the outer sides of the sidewall spacers 47.

As a result of the second step, the structure shown in FIG. 3B is formed. Specifically, each gate electrode has a dual-layer structure where the inter-gate insulating layer 43 that is sandwiched between the floating gate electrode 20 and the control gate electrode 21. In addition, when viewed in a section taken in the BL direction, structures in each of which the $n^-$ diffusion layers 49 are added respectively to the two sides of each $n^+$ diffusion layer 48 is formed for the drain diffusion layers 22 and the source diffusion layers 23 of the memory cells.

Figure 4:
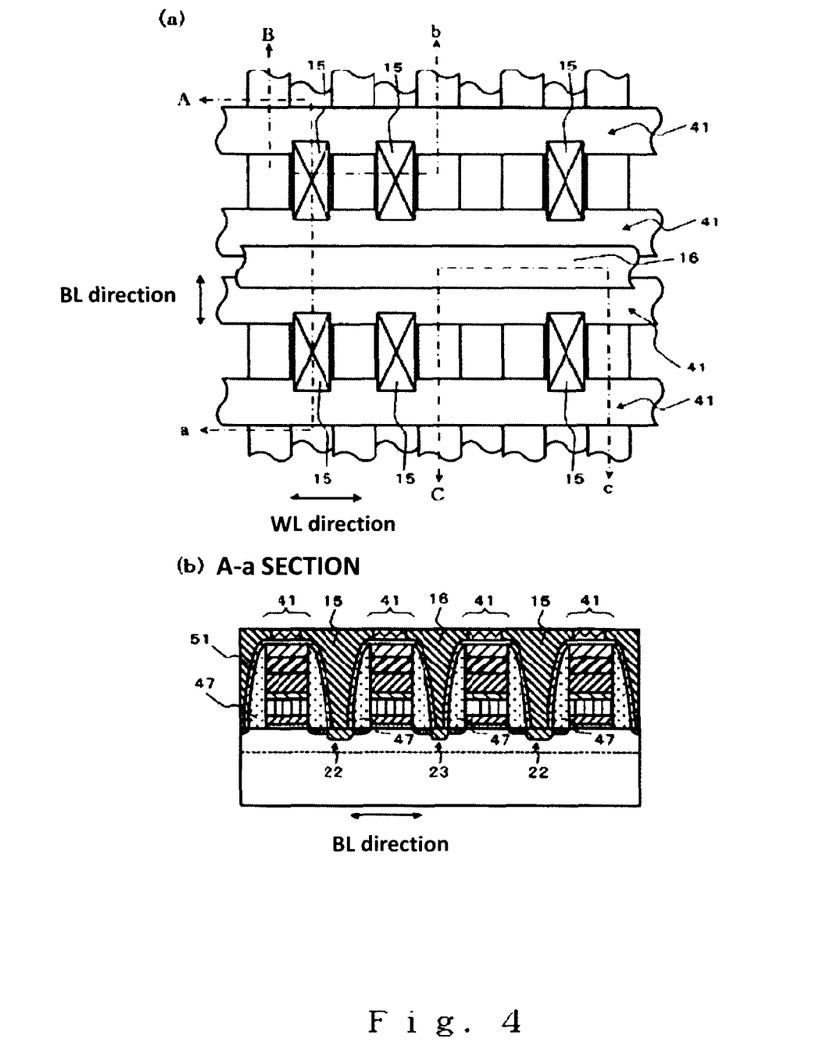
FIG. 4 is a diagram illustrating a step included in the method of manufacturing the non-volatile semiconductor memory device of the embodiment.
Figure 5:
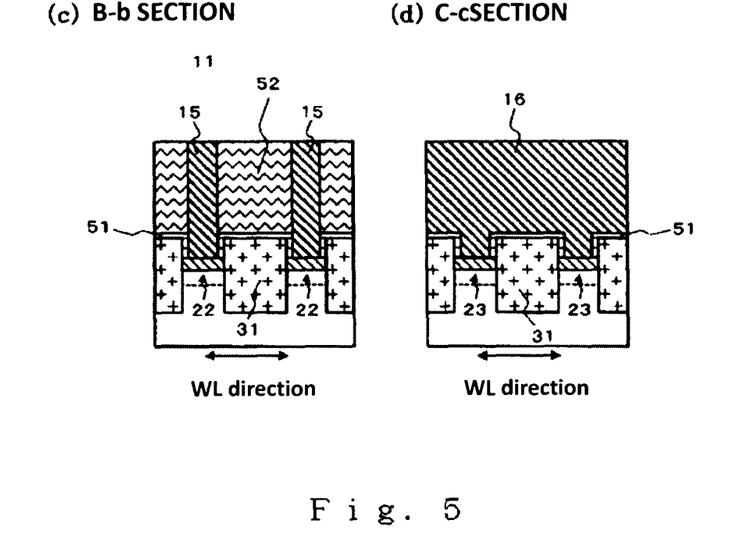
FIG. 5 is a diagram illustrating a step included in the method of manufacturing the non-volatile semiconductor memory device of the embodiment.

FIGS. 4 and 5 show a third step that illustrates the structure after drain contact plugs 15 and local interconnects 16 are formed. The drain contact plugs 15 and the local interconnect 16 are formed in a self-aligned manner using the gate electrodes of the memory cells.

Firstly, the structure shown in FIG. 3 is subjected to a process of forming a third silicon nitride layer 51 and a first interlayer insulating layer 52. Specifically, the third silicon nitride layer 51 is firstly formed to serve as an etching stopper when the openings for contact holes are formed. Then, on the third silicon nitride layer 51, a boron-phosphorus-silicate-glass (BPSG) film is deposited in an ordinary-pressure CVD process. Then, the BPSG film thus formed is reflowed. After that, the BPSG film is polished in a CMP process using the third silicon nitride layer 51 as a stopper until the top surface of the upper portion of the third silicon nitride layer 51 is exposed. Thus formed is the first interlayer insulating layer 52.

Subsequently, a resist pattern (a window pattern for processing drain contacts) to form drain contact holes is formed on the first interlayer insulating layer 52 made of the BPSG film. The window pattern for processing drain contacts is formed in the resist on the first interlayer insulating layer 52 in a photolithography process. In the window pattern for processing drain contacts, opening portions each of which has a shape of a rectangular hole are formed above the positions of first interlayer insulating layer 52 that correspond respectively to the drain diffusion layers 22. The openings are formed to cover partly the upper portions of the gate electrodes. In such an etching process using the window pattern for forming drain contacts, drain contact holes with a self-aligning structure are formed. Specifically, in a sectional view taken in the BL direction, each drain contact hole has a funnel-like shape gradually narrowing from the widest upper portion to the lower portion. At the bottom portion, the drain contact hole reaches the corresponding drain diffusion layer 22 and has a width that is equal to the width of the drain diffusion layer 22 (see the drain contact plugs 15 in FIG. 4B).

Subsequently, a groove pattern for processing local interconnects is formed. The groove pattern is used for forming local interconnects for the source grooves. The groove pattern for processing local interconnects is formed in a resist on the first interlayer insulating layer 52 in a photolithography process. In this groove pattern, opening portions are formed respectively above the positions of the first interlayer insulating layer 52 that correspond respectively to the source diffusion layers 23. The end portions, in the BL direction, of each opening portions cover partly the upper portion of the corresponding gate electrode. Each opening portion is formed in a groove-like shape extending in the WL direction across memory cell regions 13a, 13b, and the shunt region 14. In such an etching process using this groove pattern for processing local interconnects, grooves for local interconnects with a self-align structure are formed. Specifically, in a sectional view taken in the BL direction, each groove for local interconnects has a funnel-like shape gradually narrowing from the widest upper portion to the lower portion. At the bottom portion, the groove for local interconnects reaches the corresponding source diffusion layer 23 and has a width that is equal to the width of the source diffusion layer 23 (see the local interconnects 16 in FIG. 4B).

Subsequently, the first interlayer insulating layer 52 is etched in an RIE method using both of the window pattern for processing drain contacts and the groove pattern for processing local interconnects. In this etching process, the third silicon nitride silicon layer 51 is used as the stopper. Thus formed are the drain contact holes and the grooves for local interconnects. After that, the portions of the third silicon nitride layer 51 that remain in the bottom portions of the drain contact holes and the grooves for local interconnects are removed so that the $n^+$ diffusion layers 48 of the drain diffusion layer 22 and the source diffusion layer 23 are exposed.

Subsequently, the drain contact plugs 15 and the local interconnects 16 are formed. Specifically, a titanium film is formed as a first barrier metal layer in a sputtering process. Then, a tungsten film as a conductive material is deposited in a CVD process to fill in the drain contact holes and in the grooves for local interconnects. Then, the tungsten film and the upper portion of the titanium film are polished and removed by a CMP process to get a flat surface.

As a result of the third step, the drain contact plugs 15 and the local interconnects 16 are formed in a self-aligned manner.

Figure 6:
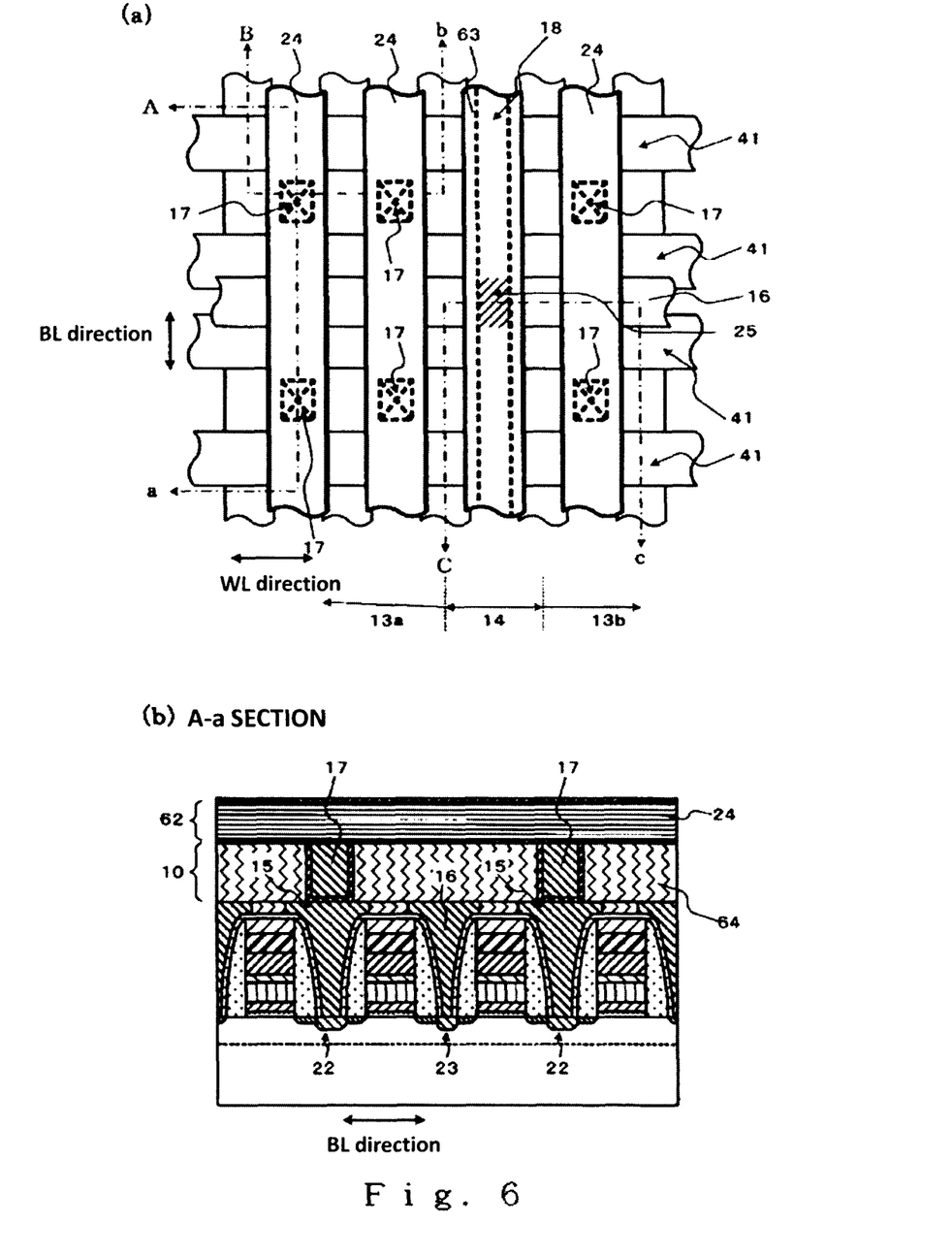
FIG. 6 is a diagram illustrating a step included in the method of manufacturing the non-volatile semiconductor memory device of the embodiment.
Figure 7:
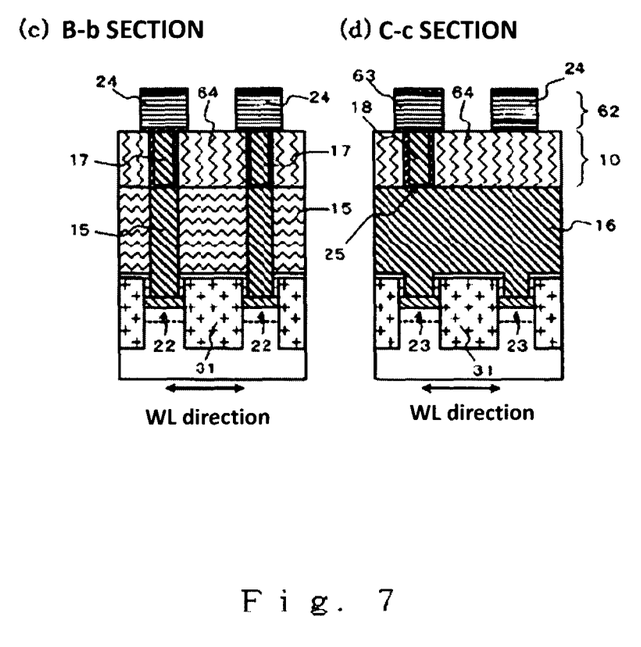
FIG. 7 is a diagram illustrating a step included in the method of manufacturing the non-volatile semiconductor memory device of the embodiment.

FIGS. 6 and 7 show a fourth step that illustrates the structure after a via-contact layer 10 and an upper-layer wiring layer 62 are formed.

Drain via plugs 17 and power supply vias 18 for source are formed in the via-contact layer 10 whereas bit lines 24 and source lines 63 are formed in the upper-layer wiring layer 62. The drain via plugs 17 electrically connect the bit line 24 of the upper layer to the drain contact plugs 15 whereas the power supply vias 18 for source electrically connects the source line 63 of the upper-layer wirings to the local interconnects 16. In FIG. 6A, the drain via plug 17 and the power supply vias 18 for source are shown by dashed lines because these elements are hidden under the upper-layer wirings.

Firstly, a fifth silicon oxide layer as a second interlayer insulating layer 64 is deposited on the structure shown in FIGS. 4 and 5 in a CVD process using TEOS. Then, a predetermined resist pattern is formed on the second interlayer insulating layer 64 in a photolithography process. Openings each of which has a shape of a rectangular hole are formed in a resist on the second interlayer insulating layer 64 at positions corresponding respectively to the drain contact plugs 15. In addition, groove-shaped openings extending in the BL direction are formed in the resist on the second interlayer insulating layer 64 at positions corresponding respectively to the shunt regions 14.

Subsequently, the second interlayer insulating layer 64 of the positions corresponding to the drain contact plugs 15 is removed in an RIE method using the resist pattern. Thus formed are via-contact holes that reaches to their corresponding drain contact plugs 15. Likewise, the second interlayer insulating layer 64 of the positions corresponding to the shunt regions 14 is removed in groove-like shapes. Thus formed are via-contact grooves that reach the local interconnects 16 at joint portions 25 (SSC).

Subsequently, drain via-contacts and the power supply vias 18 for source are formed. Specifically, a titanium film is firstly deposited as a second barrier metal layer. Then, on the titanium film, a tungsten film as a conductive material is deposited to fill in the via-contact holes and in the via-contact grooves. Then, the tungsten film and the upper portion of the titanium film is polished and removed in a CMP process to get a flat surface. As a result of these processes, the drain via plugs 17 and the power supply vias 18 for source are formed in the via-contact layer 10.

Subsequently, the bit lines 24 and the source lines 63 are formed in the upper-layer wiring layer 62. Specifically, each bit line 24 extending in the BL direction is formed on the drain via plugs 17 that are electrically connected to the drain diffusion layers 22 with the drain contact plugs 15 located in between. Each source line 63 extending in the BL direction is formed on the corresponding power supply via 18 for source that is electrically connected to the source diffusion layers 23 with the local interconnects 16 located in between. The bit lines 24 and the source lines 63 are formed so that the repeating pitch of the bit lines 24 in the WL direction is equal to that of the source lines 63.

As a result of the above-described fourth step, the drain contacts are formed to electrically connect the drain diffusion layers 22 and bit lines 24 of the memory cells whereas the source contacts are formed to electrically connect the source diffusion layers 23 and the source lines 63 of the memory cells.

As has been described thus far, in this embodiment, the device forming regions 35 each of which extends in the BL direction are formed in the surface of the semiconductor substrate 19 whereas each of the device isolation regions 31 is formed between each two adjacent device forming regions 35. In the device forming regions 35, the channel regions of the memory cells as well as the drain diffusion layers 22 made of the $n^+$ diffusion layers 48 and the source diffusion layers 23 made of the $n^-$ diffusion layers 49 are formed.

Each word line 41 that extends in the WL direction of the memory cell array is formed across the device forming regions 35 and the device isolation regions 31. The word lines 41 serve also as the control gate electrodes 21 of the memory cells. The gate electrode of each memory cell has a dual-layer gate structure including the floating gate electrode 20 and the control gate electrode 21. The bit lines 24 each of which extends in the BL direction is formed in a layer above the word lines 41 with an interlayer insulating layer located in between. The bit lines 24 are electrically connected to the drain diffusion layers 22 of the memory cells with the drain contacts formed in the device forming regions 35. Each drain contact is formed by the drain contact plug 15 and the drain via plug 17. The bit lines 24 are in contact with the drain contact, and arranged in parallel to each other above the device forming regions 35 of the memory cell regions 13a, 13b. The source lines 63 for shunting purposes that supply electric power of the ground potential to the source diffusion layers 23 are formed in parallel to the bit lines 24 above the shunt region 14. The source lines 63 are electrically connected to the source diffusion layers 23. The electrical connection is accomplished by the power supply vias 18 for source and the line-like local interconnects 16. Each of the power supply vias 18 for source is formed in the corresponding shunt region 14 to be joined to the bottom surface of the corresponding source line 63 in a line-like manner. Each of the line-like local interconnects 16 is joined commonly to the source diffusion layers 23 arranged in the BL direction. The local interconnects 16 and the power supply vias 18 for source are joined to each other at portions (the joint portions 25) where these members intersect with each other in a perpendicular manner.

In the memory cell array provided by the embodiment, the repeating pitch, in the WL direction, of the drain via plugs 17 is equal to the repeating pitch, in the same direction, of the power supply vias 18 for source. Thus provided is a favorable memory cell array where the cyclic pattern of the memory cells, particularly the cyclic pattern in the via-contact layer 10 is secured. Accordingly, a non-volatile semiconductor memory device can be manufactured at lower costs without increasing the area of the chip.

According to the above-described embodiment, the cyclic pattern of the via-contacts can be secured while the increase in the area of the chip can be prevented. Accordingly, a reliable non-volatile semiconductor memory device manufactured at lower costs can be provided together with a method of manufacturing such a non-volatile semiconductor memory device.

In the above-described embodiment, the drain contact plugs 15 and the local interconnects 16 are formed using the gate electrodes of the memory cells in a self-aligned manner. The invention, however, is not limited to this. Rather, the invention is applicable, in principle, to a case where the drain contact plugs 15 and the local interconnects 16 are formed in an ordinary manner.

In the above-described embodiment, a p-type silicon substrate is used as the semiconductor substrate 19. The invention, however, is not limited to this. For example, the invention is also applicable to a non-volatile semiconductor memory device with an n-type silicon substrate used for the purpose.

In the above-described embodiment, the drain diffusion layers 22 and the source diffusion layers 23 of the memory cells have an LDD structure. The invention, however, is not limited to this. For example, the invention is also applicable to ordinary memory cells that have no LDD structure.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
   a plurality of memory cells formed on a surface of a semiconductor substrate;
   a plurality of first memory cell rows in each of which some of the plurality of memory cells are arranged in a second direction while sharing source diffusion layers and drain diffusion layers;
   a plurality of second memory cell rows formed by arranging the plurality of first memory cell rows in a repeated manner in a first direction that is perpendicular to the second direction;
   a plurality of memory cell regions in each of which two or more of the plurality of second memory cell rows are arranged;
   a shunt region located between each adjacent two of the memory cell regions arranged in the first direction;
   drain contact plugs which are provided in each of the memory cell regions and each of which is formed to have a bottom end electrically connected to the drain diffusion layer of each adjacent two of the plurality of memory cells;
   a line-shaped local interconnect which is formed to extend in the first direction across the memory cell region and the shunt region and to have a bottom end electrically connected commonly to the source diffusion layers of the plurality of memory cells belonging to each of the plurality of first memory cell rows;
   a source line which is formed to extend in the second direction;
   a bit line which is formed to extend in the second direction;
   drain via plugs, each of the drain via plugs being provided in the memory cell region and formed to have a bottom end portion electrically connected to a top end of each of the drain contact plugs and a top end portion electrically connected to a bottom end of the bit line; and
   a line-shaped power supply via for source which is formed to extend in the shunt region in the second direction, and to have a bottom end portion electrically connected to a top end of the line-shaped local interconnect at a portion where the line-shaped power supply via for source intersects the interconnect in a perpendicular manner, and a top end portion electrically connected to the source line, the line-shaped power supply via for source and the drain via plugs formed in a same layer level.

2. The non-volatile semiconductor memory device according to claim 1, wherein the drain via plugs have a first drain via plug adjacent to the line-shaped power supply via for source in the first direction and a second drain via plug adjacent to the first drain via plug in the first direction; and
   a distance between the first drain via plug and the line-shaped power supply via for source in the first direction is the same as a distance between the first drain via plug and the second drain via plug in the first direction.

3. The non-volatile semiconductor memory device according to claim 1, wherein the drain contact plug and the local interconnect are each formed so that a bottom end thereof in contact with the drain diffusion layer or the source diffusion layer has a narrower width in the second direction than a top end thereof.

* * * * *